US009530990B2

(12) United States Patent
Chen et al.

(10) Patent No.: US 9,530,990 B2
(45) Date of Patent: Dec. 27, 2016

(54) PLASMA CURING OF PECVD HMDSO FILM FOR OLED APPLICATIONS

(71) Applicant: Applied Materials, Inc., Santa Clara, CA (US)

(72) Inventors: Jrjyan Jerry Chen, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/236,603

(22) Filed: Aug. 15, 2016

(65) Prior Publication Data

US 2016/0351861 A1 Dec. 1, 2016

Related U.S. Application Data

(63) Continuation of application No. 14/179,350, filed on Feb. 12, 2014, now Pat. No. 9,431,631.

(60) Provisional application No. 61/775,961, filed on Mar. 11, 2013.

(51) Int. Cl.
| H01L 21/00 | (2006.01) |
| H01L 51/56 | (2006.01) |
| H01L 51/52 | (2006.01) |
| H01L 51/00 | (2006.01) |
| C09D 183/04 | (2006.01) |
| C23C 16/50 | (2006.01) |
| C23C 16/40 | (2006.01) |

(52) U.S. Cl.
CPC ............. *H01L 51/56* (2013.01); *C09D 183/04* (2013.01); *C23C 16/401* (2013.01); *C23C 16/50* (2013.01); *H01L 51/0034* (2013.01); *H01L 51/5256* (2013.01)

(58) Field of Classification Search
CPC ...................................................... H01L 21/00
See application file for complete search history.

(56) References Cited

U.S. PATENT DOCUMENTS

| 6,465,953 | B1 | 10/2002 | Duggal |
| 2004/0152390 | A1 | 8/2004 | Chung et al. |
| 2006/0145146 | A1 | 7/2006 | Suh et al. |
| 2010/0233383 | A1 | 9/2010 | Srdanov et al. |
| 2012/0199872 | A1 | 8/2012 | Chen et al. |

(Continued)

FOREIGN PATENT DOCUMENTS

| KR | 10-2001-0101231 | 11/2001 |
| KR | 10-1560234 B1 | 10/2015 |

(Continued)

OTHER PUBLICATIONS

PCT Notification of Transmittal of the International Search Report and the Written Opinion of the International Searching Authority for International Application No. PCT/US2014/016103 dated May 27, 2014; 13 total pages.

(Continued)

*Primary Examiner* — Marvin Payen
(74) *Attorney, Agent, or Firm* — Patterson & Sheridan, LLP

(57) ABSTRACT

Methods for forming an OLED device are described. An encapsulation layer having a buffer layer sandwiched between barrier layers is deposited over an OLED structure. The buffer layer is deposited on the first barrier layer and is cured with a fluorine-containing plasma at a temperature less than 100 degrees Celsius. The second barrier layer is then deposited on the buffer layer.

18 Claims, 3 Drawing Sheets

(56) References Cited

U.S. PATENT DOCUMENTS

| | | |
|---|---|---|
| 2012/0208306 A1 | 8/2012 | Haas et al. |
| 2014/0024180 A1 | 1/2014 | Choi et al. |
| 2014/0065739 A1 | 3/2014 | Chen et al. |

FOREIGN PATENT DOCUMENTS

| | | |
|---|---|---|
| WO | 2012/173692 A1 | 12/2012 |
| WO | 2012/174550 A2 | 12/2012 |

OTHER PUBLICATIONS

Han-Ki Kim, Sang-Woo Kim, Do-Geun Kim, Jae-Wook Kang, Myung Soo Kim, and Woon Jo Cho, Thin Solid Films 515 (2007)4758.

Anna Maria Coclite and Karen K Gleason, J. Appl. Phys. 111(2012)073516.

Jian-Shian Lin, Ming-Hua Chung, Chen-Ming Chen, Fuh-Shyang Juang, and Lung-Chang Liu, J. Phys. Org. Chem. 24 (2011)193.

H.-J. You, Rev. Sci. Instrum. 84(2013)073513.

Kazufumi Azuma, Satoko Ueno, and Yoshiyuki, Thin Solid Films 580(2015)116.

FJH Van Assche, RT Vangheluwe, JWC Maes, WS Mischke, MD Bijker, and FC Dings, SID Dig 2004; 35:695-7.

H Lifka, HA van Esch, and JJWM Rosink, SID Dig 2004; 35:1384-7.

JJWM Rosink, H Lifka, GH Rietjens, and A Pierik, SID Dig 2005; 36:1272-5.

Renzheng Sang, Hao Zhang, Li Long, Zikai Hua, Jianling Yu Bin Wei, Xingyang Wu, Tao Feng, and, Jianhua zhang, International Conference on Electronic Packaging Technology & High Density Packaging, p. 1175 (2011).

E.N. Ermakova, S.V. Sysoev, L.D. Nikulina, I.P. Tsyrendorzhieva, V.I. Rakhlin, and M.L Kosinova, Thermochimica Acta (2015) in press.

A Yoshida, S Fujimura, T Miyake, T Yoshizawa, H Ochi, and A Sugimoto, SID Dig 2003; 34:856-9.

H. Yasuda, "Plasma Polymerization", Academic Press Inc., Orlando (1985).

N. De Geyter, R. Morent, S. Van Vlierberghe, P. Dubruel, C. Leys, and E. Schacht, Surface Engineering vol. 27, No. 8 (2011)627.

Fulvia Villani, Paolo Vacca, Giuseppe Nenna, Olga Valentino, Gianbattista Burrasca, Tommaso Fasolino, Carla Minarini and Dano della Sala, J. Phys. Chem. C, 2009, 113 (30), pp. 13398-13402.

Marcel Hemerik, Rob Van Erven, Rik Vangheluwe, james Yang, Tom Van Rijswujk, Rogier Winters, and Bas Van Rens, SID Symp. Digest Vlo. 37, Issue 1 (2006)1571.

D. Hegemann, U. Vohrer, C. Oehr, and R. Riedel, Surface and Coating Technology 116-119(1999)1033-1036.

Mirjam Theelen, David Habets, Lutz Staemmler, Hans Winands, and Pieter Bolt, Surface and Coating Technology 211 (2012)9-13.

Jrjyan Jerry Chen, "Thin Film Encapsulation by PECVD", Applied Materials.

Prashant Mandlik, Jonathan Gartside, Lin Han, I-Chun Cheng, Sigurd Wagner, Jeff A. Silvernail, Rui-Qing Ma, Michael Hack, and Julie J. Brown, Appl. Phys. Lett. 92(2008)103309.

Yun-Shiuan Li, Chih-Hung Tsai, Shao-Hsuan Kao, I-Wen Wu, Jian-Zhang Chen, Chih-I Wu, Ching-Fuh Lin, and I-Chun Cheng, Physics D: Applied Physics vol. 46, No. 43, 435502(2013).

Tae Won Kim, Min Yan, Ahmet Gun Erlat, paul A. McConnelee, Mathew Pellow, John Deluca, Thomas P. Feist, Anil R. Duggal, and Marc Schaepkens, J. Vac. Sci. Technol. A 23(2005)971.

A. P. Ghosh, L J. Gerenser, C. M. Jaman, and J. E. Fomalik, Appl. Phys. Lett. 86(2005)223503.

Seung-Woo Seo, Heeyeop Chae, Sang Joon Seo, Ho Kyoon Chung, and Sung Min Cho, Appl. Phys. Lett. 102(2013) 161908.

P. F. Carcia, R. S. McLean, M. D. Groner, A. A. Dameron, and S. M. George, J. Appl. Phys. 106(2009)023533.

F. L. Wang, M. K. Fung, S. L. Tao, S. L. Lai, W. M. Tsang, K. H. Kong, W. M. Choy, C. S. Lee, and T. S. Lee, J. Appl. Phys. 104(2008)014509.

PLASMA CURING OF PECVD HMDSO FILM FOR OLED APPLICATIONS

CROSS-REFERENCE TO RELATED APPLICATIONS

This application is a continuation of co-pending U.S. patent application Ser. No. 14/179,350, filed Feb. 12, 2014, which claims benefit of U.S. Provisional Patent Application Ser. No. 61/775,961, filed Mar. 11, 2013. Each of the aforementioned related patent applications is herein incorporated by reference.

BACKGROUND

Field

Embodiments of the invention generally relate to methods for forming an organic light emitting diode (OLED) device, more particularly, to methods for encapsulating an OLED structure.

Description of the Related Art

An OLED is used in the manufacture of television screens, computer monitors, mobile phones, other hand-held devices, etc. for displaying information. OLED displays have gained significant interest recently in display applications due to their faster response time, larger viewing angles, higher contrast, lighter weight, low power and amenability to flexible substrates such as compared to liquid crystal displays (LCD).

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

Therefore, an improved method and apparatus for encapsulating an OLED structure is needed.

SUMMARY

Methods for forming an OLED device are described. An encapsulation layer having a buffer layer sandwiched between barrier layers is deposited over an OLED structure. The buffer layer is deposited on the first barrier layer and is cured with a fluorinated plasma at a temperature less than 100 degrees Celsius. The second barrier layer is then deposited on the buffer layer.

In one embodiment, a method for forming an OLED device is disclosed. The method includes depositing a first barrier layer on a region of a substrate having an OLED structure disposed thereon, depositing a buffer layer on the first barrier layer, curing the buffer layer with a fluorine-containing plasma at a temperature less than about 100 degrees Celsius, and depositing a second barrier layer on the cured buffer layer.

In another embodiment, a method for forming an OLED device is disclosed. The OLED device includes depositing a first barrier layer on a region of a substrate having an OLED structure disposed thereon, depositing a buffer layer on the first barrier layer, curing the buffer layer with a fluorine-containing plasma for about 2 minutes, and depositing a second barrier layer on the cured buffer layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming an OLED device are described. An encapsulation layer having a buffer layer sandwiched between barrier layers is deposited over an OLED structure. The buffer layer is deposited on the first barrier layer and is cured with a fluorine-containing plasma at a temperature less than 100 degrees Celsius. The second barrier layer is then deposited on the buffer layer.

Figure 1:
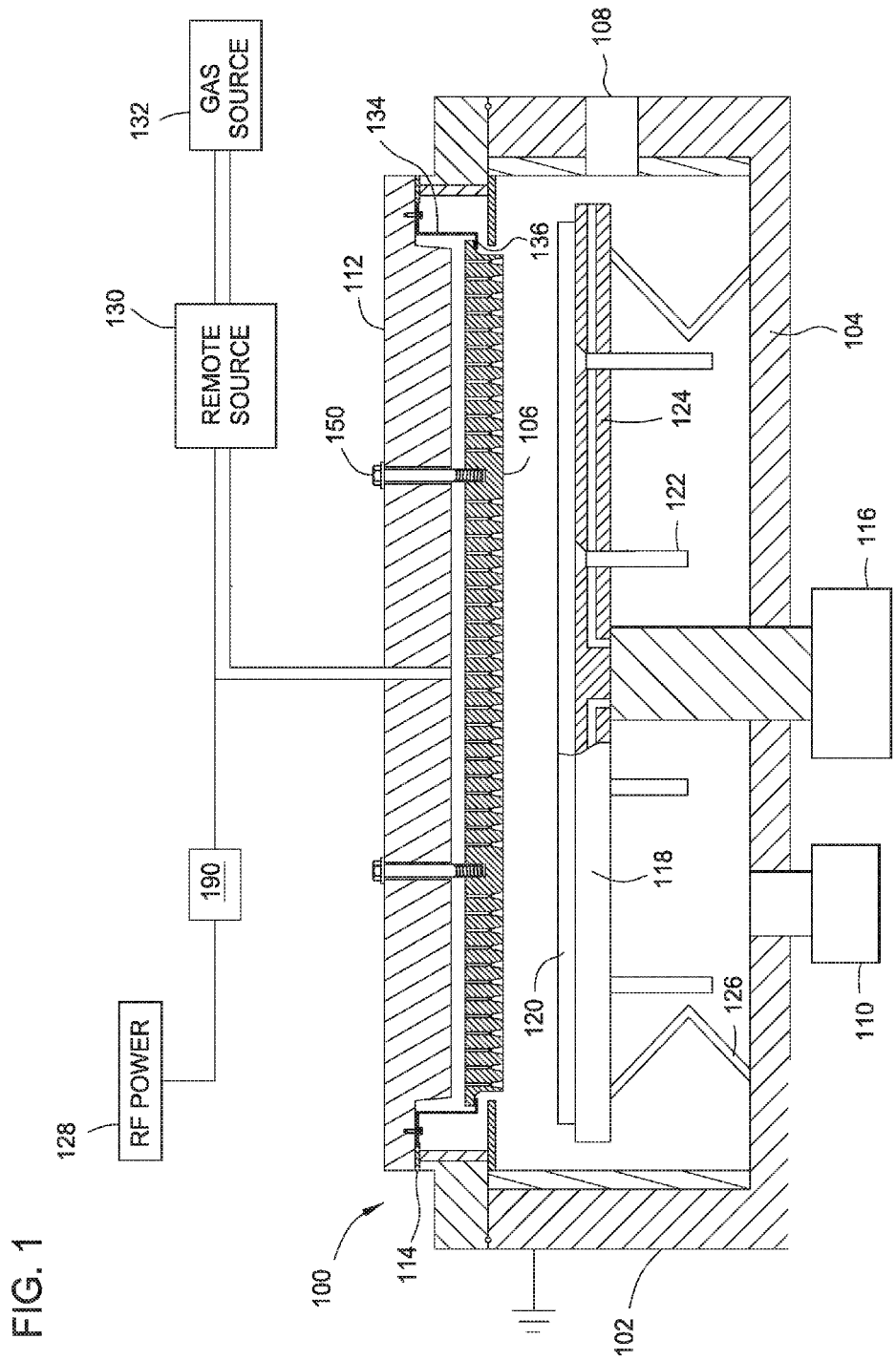
FIG. 1 is a schematic, cross-sectional view of a PECVD apparatus that may be used to perform the methods described herein.

FIG. 1 is a schematic, cross sectional view of a plasma enhanced chemical vapor deposition (PECVD) apparatus that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move the substrate 120 to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 may be coupled to the backing plate 112 by one or more fastening mechanisms 150 to help prevent sag and/or control the straightness/curvature of the showerhead 106.

A gas source 132 is coupled to the backing plate 112 to provide gas through gas passages in the showerhead 106 to a processing area between the showerhead 106 and the substrate 120. A vacuum pump 110 is coupled to the chamber 100 to maintain the process volume at a desired pressure. An RF source 128 is coupled through a match network 190 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
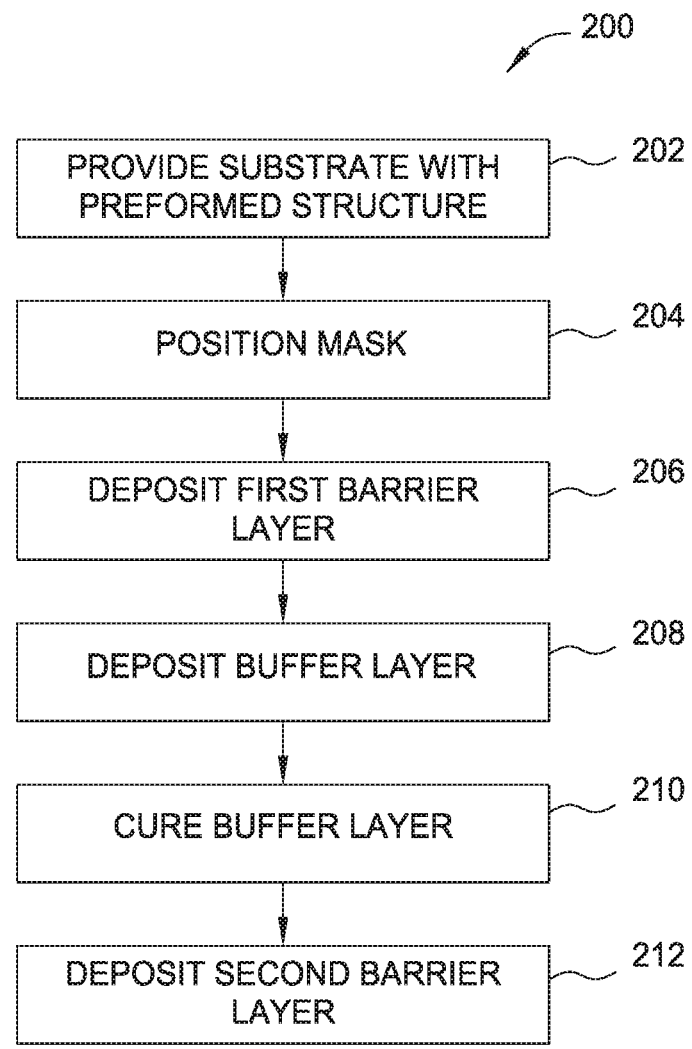
FIG. 2 is a flow diagram of a method for forming an OLED device in accordance with one embodiment of the present invention.
Figure 3A:
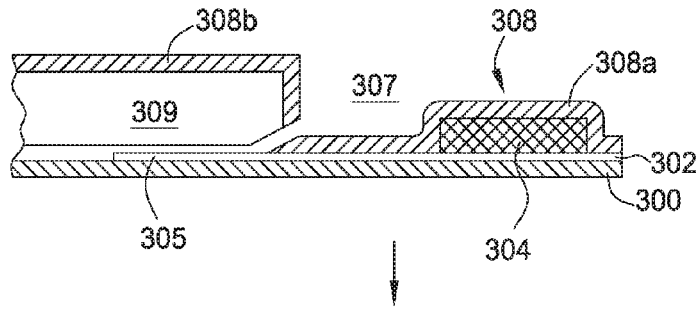
FIGS. 3A-3D illustrate schematic cross-sectional views of the OLED device during different stages of the method of FIG. 2.

FIG. 2 is a flow diagram of a method 200 for forming an OLED device according to various embodiments of the invention. FIGS. 3A-3D illustrate schematic cross-sectional views of an OLED device during different stages of the method 200 of FIG. 2. The method 200 starts at process 202 by providing a substrate 300 having a preformed OLED structure 304 disposed thereon. The substrate 300 may have a contact layer 302 disposed thereon, with the OLED structure 304 disposed on the contact layer 302, as shown in FIG. 3A.

At process 204, a mask 309 is aligned over the substrate 300 such that the OLED structure 304 is exposed through an opening 307 unprotected by the mask 309, as shown in FIG. 3A. The mask 309 is positioned such that a portion 305 of the contact layer 302 adjacent the OLED structure 304 is covered by the mask 309 so that the any subsequently deposited material does not deposit on the portion 305. The portion 305 of the contact layer 302 is the electrical contact for the OLED device, thus no material should be deposited thereon. The mask 309 may be made from a metal material, such as INVAR®.

At process 206, a first barrier layer 308 is deposited on the substrate 100, as shown in FIG. 3A. The first barrier layer 308 has a first portion 308a and a second portion 308b. The first portion 308a of the first barrier layer 308 is deposited through the opening 307 onto a region of the substrate 300 exposed by the mask 309, which includes the OLED structure 304 and a portion of the contact layer 302. The second portion 308b of the first barrier layer 308 is deposited on the mask 309 covering a second region of the substrate 300, which includes the portion 305 of the contact layer 302. The first barrier layer 308 is a dielectric layer, such as silicon nitride (SiN), silicon oxynitride (SiON), silicon dioxide ($SiO_2$), aluminum oxide ($Al_2O_3$), aluminum nitride (AlN), or other suitable dielectric layers. The first barrier layer 308 may be deposited by a suitable deposition technique, such as chemical vapor deposition (CVD), PECVD, physical vapor deposition (PVD), spin-coating, or other suitable technique.

Figure 3B:
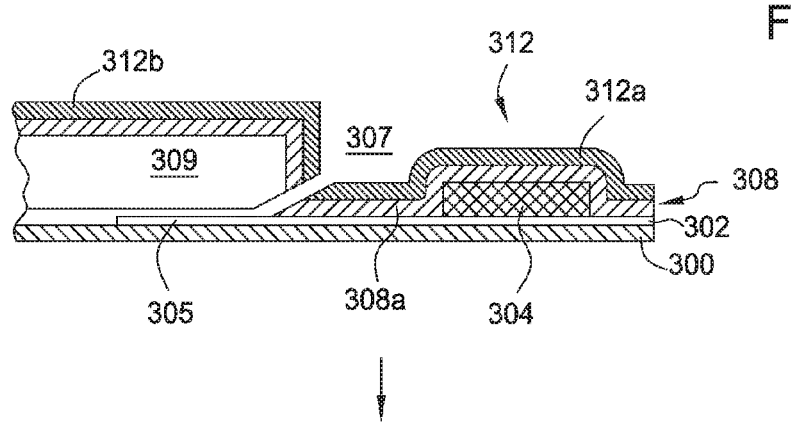

At process 208, after the first barrier layer 308 is deposited on the substrate 300, a buffer layer 312 is then deposited on the first barrier layer 308 on the substrate 300, as shown in FIG. 3B. A first portion 312a of the buffer layer 312 may be deposited on the substrate 300 through the opening 307 of the mask 309 on the region of the substrate 300 exposed by the mask 309, covering the first portion 308a of the first barrier layer 308. A second portion 312b of the buffer layer 312 is deposited on the second portion 308b of the first barrier layer 308 disposed on the mask 309, which covers the portion 305 of the contact layer 302.

The buffer layer 312 may be acrylate, methacrylate, acrylic acid, or the like. In one embodiment, the buffer layer 312 is plasma-polymerized hexamethyldisiloxane (pp-HMDSO). Deposition of the pp-HMDSO material layer is achieved by flowing an oxygen-containing gas and HMDSO gas. In one example, the oxygen-containing gas is nitrous oxide ($N_2O$). A low $N_2O$/HMDSO flow ratio (e.g., less than 2) may be maintained during processing to deposit a pp-HMDSO layer having characteristics including stress relief, particle conformality, and flexibility. These characteristics of the pp-HMDSO layer helps serving as a buffer layer to decouple the defects in the first barrier layer 308, as well as to planarize surface irregularity to form a smooth surface. However, the pp-HMDSO formed by low $N_2O$/HMDSO ratios tends to be physically soft, which will impose an integration issue when stacked with barrier layers. When an barrier layer stacks on top of soft pp-HMDSO layer, a wrinkled surface is formed and the soft pp-HMDSO layer loses the optical transmittance, which will not be suitable as top emission OLED devices.

Figure 3C:
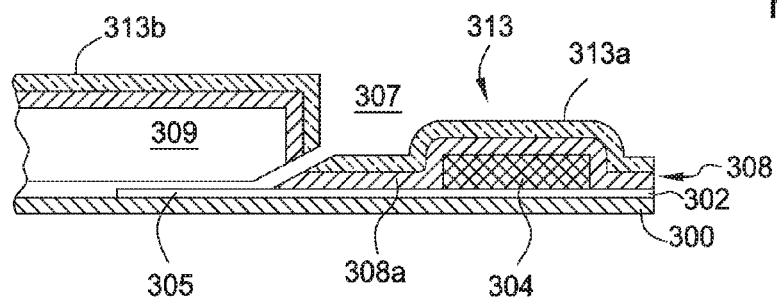

In order to harden the buffer layer 312, plasma curing of the buffer layer 312 is utilized. At process 210, the buffer layer 312 is cured to form a hardened buffer layer 313, as shown in FIG. 3C. The curing may be performed by a fluorine-containing plasma, such as nitrogen fluoride ($NF_3$), silicon fluoride ($SiF_4$), fluorine gas ($F_2$), and/or carbon tetrafluoride ($CF_4$). The fluorine-containing plasma curing of the buffer layer 312 may be performed at a temperature less than 100 degrees Celsius so that the buffer layer is hardened without permitting the oxygen to diffuse to the OLED device. In one embodiment, a $NF_3$ gas is flowed into the chamber having a flow rate of 1100 standard cubic centimeter per minute (sccm), while a plasma is generated at 1200 watts. The chamber pressure is below 500 mTorr and the distance between the substrate 300 and the showerhead 106 is about 1 m. The plasma curing is performed at about 80 degrees Celsius and the curing duration is about 2 minutes. The hardened buffer layer 313 can maintain the flexibility and optical transmittance as one or more barrier layers are subsequently deposited thereon.

The curing duration may depend on the thickness of the buffer layer 312. In general, for every micrometer of the buffer layer 312, one minute of curing is performed. In one embodiment, the buffer layer 312 is about 2 micrometers thick, and the curing time is about two minutes.

Figure 3D:
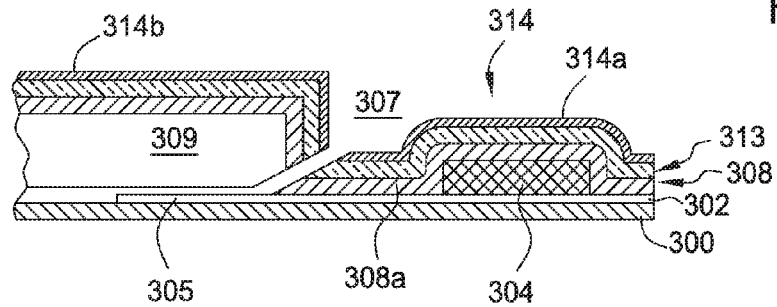

At process 212, a second barrier layer 314 is deposited on the substrate 100, covering the hardened buffer layer 313 and the first barrier layer 308 formed on the OLED structure 304, as shown in FIG. 3D. The second barrier layer 314 includes a first portion 314a deposited over the first portion 313a of the hardened buffer layer 313 and a second portion 314b deposited over the second portion 313b of the hardened buffer layer 313.

The second barrier layer 314 may be a dielectric layer similar to the first barrier layer 308. The second barrier layer 314 is a dielectric layer such as SiN, SiON, $SiO_2$, or other suitable dielectric layers. The second barrier layer 314 may be deposited by a suitable deposition technique, such as CVD, PVD, spin-coating, or other suitable technique.

The deposition of the barrier layers and the buffer layer, and the curing of the buffer layer as described herein may be performed in a single deposition chamber, such as the PECVD chamber 100. Purging of the process chamber may be performed between cycles to minimize the risk of contamination. In one embodiment, the first barrier layer is deposited. The chamber is then purged so the gases used for the deposition of the first barrier layer are not present in the chamber for the subsequent processes. Next the buffer layer is deposited. The chamber is then purged again so the gases used for the deposition of the buffer layer are not present in the chamber for the subsequent processes. Next the buffer layer is cured, followed by another purge of the chamber. Lastly the second barrier layer is deposited. The single chamber process may be advantageous in reducing cycle times as well as reducing the number of chambers (and equipment costs) of using a multiple chamber process.

In summary, an OLED device is formed with a buffer layer sandwiched between two barrier layers. The buffer layer is cured with a fluorine-containing plasma at a temperature less than 100 degrees Celsius prior to the deposition of a barrier layer thereon.

While the foregoing is directed to embodiments of the present disclosure, other and further embodiments of the disclosure may be devised without departing from the basic scope thereof, and the scope thereof is determined by the claims that follow.

The invention claimed is:

1. A method for forming an organic light emitting diode (OLED) device, comprising:
   depositing a first barrier layer on a region of a substrate having an OLED structure disposed thereon;
   depositing a buffer layer on the first barrier layer;
   curing the buffer layer with a fluorine-containing plasma; and
   depositing a second barrier layer on the cured buffer layer.

2. The method of claim 1, wherein the buffer layer comprises plasma-polymerized hexamethyldisiloxane (pp-HMDSO).

3. The method of claim 2, wherein a curing time is related to a thickness of the buffer layer, wherein the relationship is 1 minute per micrometer.

4. The method of claim 1, wherein the fluorine-containing plasma comprises $NF_3$, $SiF_4$, $F_2$, $CF_4$, or any combination thereof.

5. The method of claim 1, wherein the depositing the first and second barrier layers and the buffer layer and the curing of the buffer layer are performed in a single process chamber.

6. The method of claim 5, wherein the single process chamber is a PECVD chamber.

7. The method of claim 1, wherein the curing the buffer layer with a fluorine-containing plasma is at a temperature less than about 100 degrees Celsius.

8. The method of claim 1, wherein a duration for the curing the buffer layer with a fluorine-containing plasma is about 2 minutes.

9. A method for forming an OLED device, comprising:
   forming a contact layer over a substrate;
   forming an OLED structure over the contact layer;
   depositing a first barrier layer over the OLED structure;
   depositing a buffer layer on the first barrier layer;
   curing the buffer layer with a fluorine-containing plasma; and
   depositing a second barrier layer on the cured buffer layer.

10. The method of claim 9, wherein the buffer layer comprises plasma-polymerized hexamethyldisiloxane (pp-HMDSO).

11. The method of claim 10, wherein a curing time is related to a thickness of the buffer layer, wherein the relationship is 1 minute per micrometer.

12. The method of claim 9, wherein the fluorine-containing plasma comprises $NF_3$, $SiF_4$, $F_2$, $CF_4$, or any combination thereof.

13. The method of claim 9, wherein the depositing the first and second barrier layers and the buffer layer and the curing of the buffer layer are performed in a single process chamber.

14. The method of claim 13, wherein the single process chamber is a PECVD chamber.

15. The method of claim 9, wherein the first barrier layer comprises SiN, SiON, $SiO_2$, $Al_2O_3$, or AlN.

16. The method of claim 15, wherein the second barrier layer comprises SiN, SiON or $SiO_2$.

17. The method of claim 9, wherein the curing the buffer layer with a fluorine-containing plasma is at a temperature less than about 100 degrees Celsius.

18. The method of claim 9, wherein a duration for the curing the buffer layer with a fluorine-containing plasma is about 2 minutes.

* * * * *